United States Patent [19]

Swanson

[11] Patent Number: 4,952,890
[45] Date of Patent: Aug. 28, 1990

[54] PHASE MODULATION COMPENSATED AMPLITUDE MODULATOR USING DIGITALLY SELECTED AMPLIFIERS

[75] Inventor: Hilmer I. Swanson, Quincy, Ill.
[73] Assignee: Harris Corporation, Melbourne, Fla.
[21] Appl. No.: 404,462
[22] Filed: Sep. 12, 1989
[51] Int. Cl.⁵ .............................................. H03C 1/04
[52] U.S. Cl. .................................... 332/152; 332/161; 332/172; 455/108
[58] Field of Search ............... 332/149, 151, 152, 159, 332/161, 172, 176, 178; 330/124 R, 295; 455/108

[56] References Cited
U.S. PATENT DOCUMENTS

| | | | |
|---|---|---|---|
| 3,480,881 | 11/1969 | Boykin | 332/149 |
| 4,580,111 | 4/1986 | Swanson | 332/152 |
| 4,804,931 | 2/1989 | Hulick | 332/149 |

Primary Examiner—Siegfried H. Grimm
Attorney, Agent, or Firm—Tarolli, Sundheim & Covell

[57] ABSTRACT

An RF amplitude modulated amplifier system is presented incorporating a plurality of RF amplifiers which are compensated for unwanted phase modulation. The system includes a common RF driver for supplying a common RF driver signal. A plurality of actuatable RF amplifiers are provided with each having an input circuit for receiving the common RF drive signal. Each amplifier has a fully on condition for amplifying the common drive signal to provide an amplified RF signal, and a fully off condition. Each of these RF amplifiers exhibits a characteristic in that its input circuit has an input impedance which is greater when fully on than that when fully off, thereby tending to present unwanted phase modulation of the plurality of RF amplifiers. One or more of the RF amplifiers are selectively turned fully on in dependence upon the magnitude of an input signal. The amplified RF signals provided by the RF amplifiers that are turned on are combined so as to provide a combined signal which is amplitude modulated in accordance with the magnitude of the input signal. Circuitry is provided for selectively adding a compensating impedance to the input circuit of each of the RF amplifiers that is not actuated to be fully on. This serves to compensate for any unwanted phase modulation of the plurality of RF amplifiers.

8 Claims, 2 Drawing Sheets

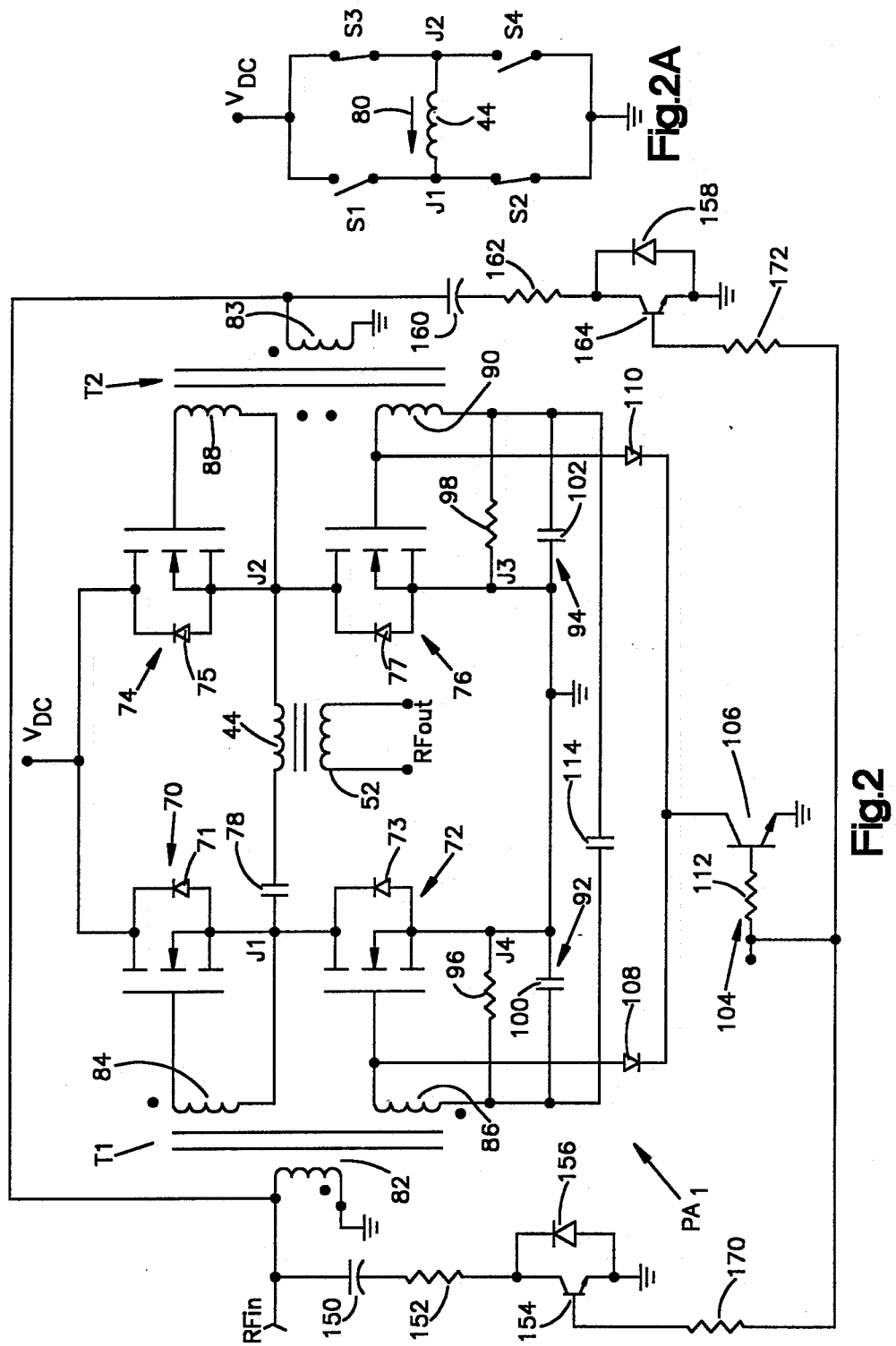

PHASE MODULATION COMPENSATED AMPLITUDE MODULATOR USING DIGITALLY SELECTED AMPLIFIERS

BACKGROUND AND FIELD OF THE INVENTION

The present invention relates to RF power amplifiers and more particularly to compensating for unwanted phase modulation thereof.

The U.S. Pat. No. 4,580,111, to H. I. Swanson, discloses an amplitude modulator which generates an amplitude modulated carrier signal by selectively turning on and off a plurality of RF amplifiers in a digital manner to produce amplitude modulation. The drive for all of the amplifiers is obtained from a common RF driver. These RF amplifiers are either fully on or fully off, each RF amplifier exhibiting a characteristic in that its input circuit has input impedance which is greater when fully on than that when it is fully off. This is due, at least in part, to a capacitance change which takes place during the operation. Thus, when such an amplifier is fully off, there is no Miller capacitance. The Miller capacitance is a function of the input-to-output capacitance and gain and is present when such an amplifier is on. Consequently, when the amplifier is off there is no gain and therefore no Miller capacitance. This change in the input impedance for each amplifier will phase modulate all of the amplifiers because they are driven from a common driver.

This unwanted phase modulation will modulate the RF carrier signal and the AM modulated signal when such RF amplifiers are employed in an AM broadcasting system. This will require wider frequency bandwidth. Also, there is a potential for interference with neighboring stations. In AM stereo broadcasting systems employing such RF amplifiers, this unwanted phase modulation may degrade the AM stereo signal resulting in distortion.

SUMMARY OF THE INVENTION

It is an object of the present invention to minimize such unwanted phase modulation of the RF amplifiers which are driven by a common RF driver by introducing a compensating impedance into the input circuit of each RF amplifier that is not turned on during the operation.

In accordance with the present invention, a phase modulation compensated RF amplitude modulated amplifier system includes a common RF driver for supplying RF driver signals. A plurality of actuatable RF amplifiers are provided with each having an input circuit for receiving a common RF drive signal. Each RF amplifier has a fully on condition for amplifying the common drive signal to provide an amplified RF signal and a fully off condition. Each of these RF amplifiers exhibits a characteristic in that its input circuit has an input impedance which is greater when fully on than that when fully off thereby tending to present unwanted phase modulation to the RF amplifiers which are driven by a common source. The RF amplifiers are selectively turned fully on in dependence upon the magnitude of an input signal to be modulated. The amplified signals provided by these selected actuated one or more of the RF amplifiers are combined to thereby provide a combined signal which is amplitude modulated in accordance with the magnitude of the input signal. Compensating impedance is added to the input circuit of each of the amplifiers that is not actuated and fully on so as to thereby minimize the unwanted phase modulation of the plurality of RF amplifiers.

BRIEF DESCRIPTION OF THE DRAWINGS

The foregoing and other objects and advantages of the present invention will become more readily apparent from the following detailed description as taken in conjunction with the accompanying drawings, wherein:

FIG. 2 is a schematic circuit illustration of one of the power amplifiers employed in FIG. 1 and which incorporates the phase modulation compensating circuit of the present invention; and FIG. 2A is a simplified schematic circuit useful in understanding the operation of the circuit shown in FIG. 2.

DESCRIPTION OF A PREFERRED EMBODIMENT

Figure 1:
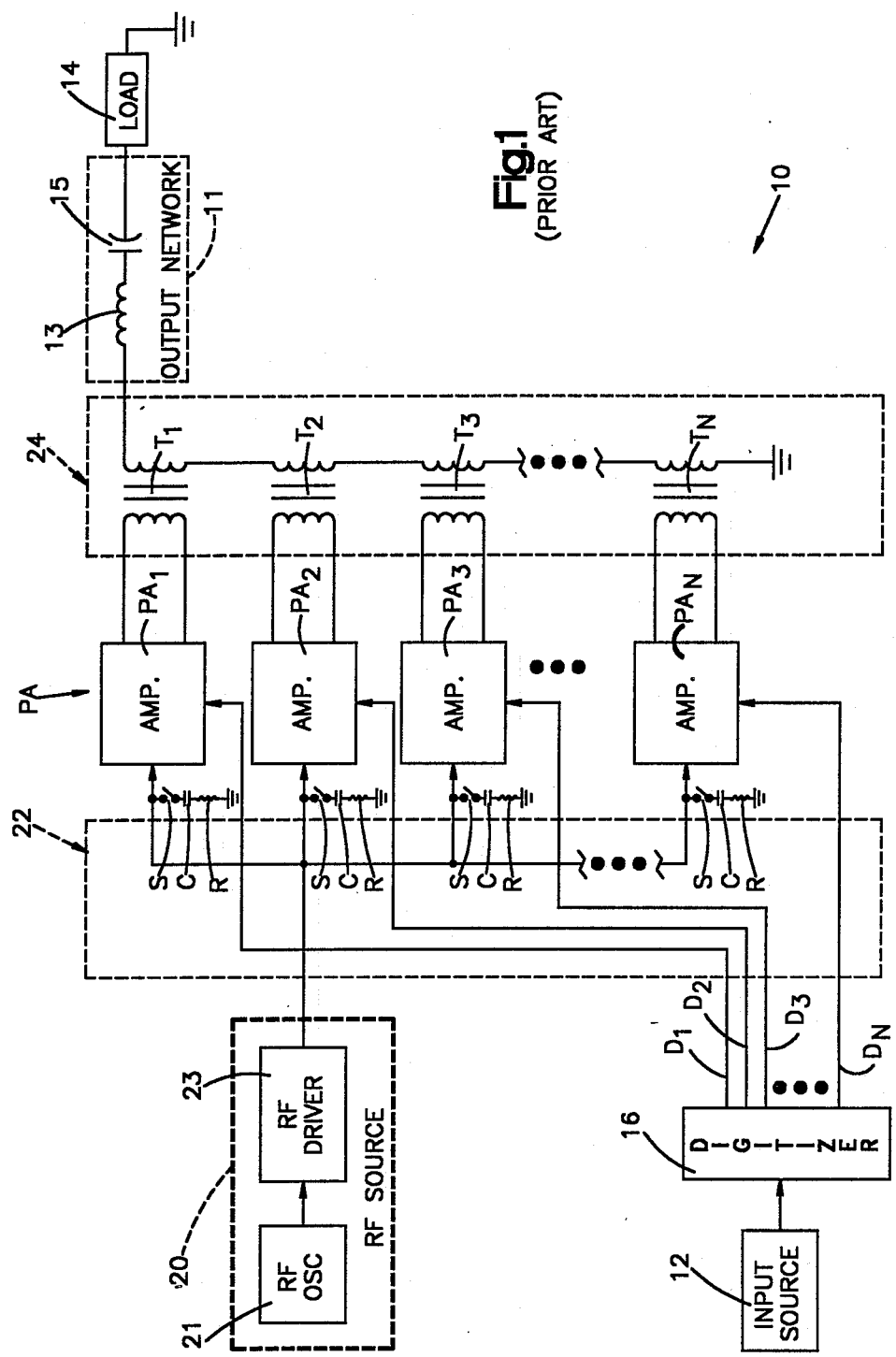
FIG. 1 is a schematic-block diagram of one application to which the present invention may be applied.

One application of the present invention is in conjunction with protecting RF power amplifiers employed in an AM broadcast transmitter. An example of such a transmitter is presented in FIG. 1 and takes the form of a digital amplitude modulator such as that illustrated and described in my aforesaid U.S. Pat. No. 4,580,111, which is assigned to the same assignee as the present invention, the disclosure of which is herein incorporated by reference. The discussion which follows is directed to an explanation of the operation of the circuitry shown in FIG. 1 followed by a detailed description of a power amplifier as illustrated in FIGS. 2 and 2A herein as background for the discussion of the phase amplitude compensation circuitry of the present invention and which is incorporated in FIG. 2.

Referring now to FIG. 1, the amplitude modulator 10 is illustrated as receiving an input signal from input source 12 which may be the source of an audio signal. Modulator 10 generates an RF carrier signal which is amplitude modulated as a function of the amplitude of the input signal from source 12. The amplitude modulated carrier signal is supplied through an impedance matching network 11, including inductor 13 and capacitor 15, to a load 14, which may take the form of an RF transmitting antenna.

A digitizer 16 provides a plurality of digital control signals D1 through DN which have values which vary in accordance with the instantaneous level of the input signal. The control signals are binary signals each having a binary 1 or a binary 0 level. The number of signals having binary 1 or binary 0 levels is dependent upon the instantaneous level of the input signal.

Each of the output control signals D1-DN is supplied to one of a plurality of N RF power amplifiers $PA_1$--$PA_N$. The control signals serve to turn associated power amplifiers either on or off. Thus, if the control signal has a binary 1 level, then its associated amplifier is inactive and no signal is provided at its output. However, if the control signal is of a binary 0 level, then the power amplifier is active and an amplified carrier signal is provided at its output. Each power amplifier has an input connected to a single common RF source 20. The RF source 20 serves as the single source of an RF carrier signal which is supplied by way of an RF splitter 22 so that each amplifier $PA_1$-$PA_N$ receives a signal of like amplitude and phase and frequency. The carrier signal is amplitude modulated in accordance with the control signals D1-DN and the amplitude modulated carrier signals will be of like frequency and phase. These signals are supplied to a combiner circuit 24 comprised of a plurality of transformers $T_1$, $T_2$, $T_3$, ..., $T_N$. The secondary windings act as an independent signal source, whereby the signals provided by the various transformers additively combine with one another to produce a combined signal which is supplied to the load 14. This combined signal has the same frequency as the RF signal supplied by the RF source 20, but the amplitude of the combined signal is modulated in accordance with the input signal supplied by the input source 12.

As is conventional in such a system, the RF source 20 includes an RF oscillator 21 having a frequency on the order of 500 to 1600 KHz. This oscillator feeds an RF driver 23, the output of which is supplied to the power amplifiers $PA_1$-$PA_N$. The RF driver provides power amplification of the RF signal obtained from oscillator 21 prior to the signal being supplied to the power amplifiers at which modulation also takes place. The RF driver 23 may include several stages of amplification and may be configured similar to the power amplifiers $PA_1$-$PA_N$.

FIG. 2 illustrates one form which the power amplifier $PA_1$ of FIG. 1 may take, the other power amplifiers $PA_2$-$PA_N$ being similar. The power amplifier illustrated includes four semiconductor amplifier elements 70, 72, 74 and 76 connected in a bridge arrangement across a DC power supply voltage of, for example, 250 volts. The primary winding 44 of the associated transformer 36 is connected across the bridge junctions $J_1$ and $J_2$ of the four semiconductor elements.

More particularly, the semiconductor amplifier elements are metal oxide semiconductor, field effect transistors (MOSFETs') having three electrodes, conventionally identified as the gate, drain, and source. The drain-source paths of the transistors 70 and 72, representing their primary current paths, are connected in series across the DC power supply, as are the drain-source current paths of transistors 74 and 76. The primary winding 44 of the corresponding combiner transformer $T_1$ is connected in series with a DC blocking capacitor 78 across the common junctions $J_1$ and $J_2$ between transistors 70 and 72 and transistors 74 and 76.

The transistors 70, 72, 74 and 76 effectively operate as switches to connect the two sides of the primary winding 44 to either the DC voltage source or to ground. By proper operation of these transistors, the transformer winding 44 can be connected in either direction across the DC power supply.

This can perhaps be more readily understood by reference to FIG. 2A, which is a simplified illustration of the FIG. 2 circuitry. In FIG. 2A the transistors 70, 72, 74 and 76 are respectively characterized by conventional single pole, single throw switches $S_1$, $S_2$, $S_3$ and $S_4$. As shown in FIG. 2A, the switch $S_1$ is open and the switch $S_2$ is closed, whereby the common junction $J_1$ between them is grounded. The switch $S_3$ is closed and the switch $S_4$ open, however, whereby the junction $J_2$ between those switches is connected to the DC supply voltage. Current will therefore pass through the primary winding 44 in the direction indicated by the arrow 80.

When all four switches $S_1$-$S_4$ are thrown to their opposite states, current will pass through the output winding 44 in the opposite direction. Thus, when switches $S_1$ and $S_4$ are closed and switches $S_2$ and $S_3$ opened, junction $J_1$ is connected to the DC supply and junction $J_2$ is connected to ground. In this case the current through the primary winding 44 of the transformer is in a direction opposite to that indicated by arrow 80 of FIG. 2A. An AC signal can thus be applied across the coil 44 by cyclically switching the switches $S_1$-$S_4$ between these two alternate states. If this is done at RF frequencies, then an RF carrier signal results.

Referring back to FIG. 2, the transistor switches 70, 72, 74 and 76 are controlled by signals applied to their gate electrodes. The gate signals for all four transistors are derived from individual secondary windings of a pair of transformers $T_1$ and $T_2$. The transformers each have a toroidal ferrite core. Primary windings 82 and 83 and four secondary windings 84, 86, 88 and 90 are wound around the cores. The turns ratio of each transformer is 1:1, whereby the same signal appearing at each primary is applied to each of the circuits connected to the four secondary windings.

Each of the four secondary windings is connected between the gate and source electrodes of an associated one of the MOSFETs 70-76. The secondary 84 is directly connected between the gate of MOSFET 70 and junction $J_1$, while secondary 88 is similarly directly connected between the gate of MOSFET 74 and junction $J_2$. The secondary windings 86 and 90 are in like manner connected between the gate and source electrodes of MOSFETs 72 and 76, however in these cases impedance networks 92 and 94 are connected in series with the coils 86 and 90, respectively. Each impedance network 92, 94 includes a parallel combination of a resistor 96, 98 and capacitor 100, 102. The purpose of these impedance networks will be described hereinafter during the description of the amplifier control circuitry 104.

The primary winding of each toroidal transformer is connected to the output of the RF source 20, which provides a sinusoidal RF driving voltage to the power amplifier. Each MOSFET turns "on" when the RF signal applied to its gate is on its positive half cycle and "off" when the applied signal is on its negative half cycle. The MOSFETs therefore cyclically turn on and off at a frequency and phase of the applied RF gate signal. The windings 84 and 90 are connected across MOSFETs 70 and 76 in similar directions whereby the signals appearing at the gates of these transistors are in phase with one another. MOSFETs 70 and 76 therefore turn on and off in unison. Windings 86 and 88, on the other hand, are connected across MOSFETs 72 and 74 in a direction opposite to the direction of connection of windings 84 and 90. The signals applied to the gates of MOSFETs 70 and 76 are therefore 180 degrees out of phase with respect to the signals applied to the gates of transistors 74 and 72. Consequently, when transistors 70 and 76 are "on", transistors 72 and 74 are "off", and vice versa.

Due to the nonlinear transfer characteristics of the MOSFETs 70, 72, 74 and 76, the MOSFETs will abruptly turn on and off in response to the applied sinusoidal signal, rather than linearly following it. The signal applied across the junctions $J_1$ and $J_2$ will therefore have essentially a squarewave form, though at the frequency of the applied RF input signal. The load 14 to which the output of the combiner circuit 24 of FIG. 1 is connected will generally be frequency selective, and will select only the fundamental component of this squarewave.

As shown in FIG. 2, the power amplifier $PA_1$ includes a switching circuit 104 for turning the power amplifier on and off in response to the control signal appearing on the digitizer output line $D_1$. The switching circuit 104 includes an NPN bipolar junction transistor 106 having its emitter grounded and its collector connected to the gates of MOSFETs 72 and 76 through corresponding diodes 108 and 110. The base of the transistor 106 is connected to the $D_1$ output of the digitizer 24 through a base resistor 112. When the control signal applied to the base resistor 112 has a high logic level (i.e., logic "1"), base current is applied to the transistor 106, forcing it into saturation. The gates of the transistors 72 and 76 are then effectively grounded through the corresponding diodes 108 and 110. This has the effect of clamping the gate signals of these transistors to a ground potential, thereby forcing both of them to remain in an "off" condition. The primary winding 44 is thus effectively disconnected from ground, thereby turning off the power amplifier. When the control signal $D_1$ applied to the base resistor 112 has a low logic level (i.e., logic "0"), however, the transistor 106 is cut off and the operation of the amplifier 26 is substantially as described previously.

The resistors 96 and 98 in the gate circuits of MOSFETs 72 and 76 limit the DC current through transistor 106 when it is saturated. Were these not included the current through the transistor 106 would be quite high because the windings 86 and 90 act as voltage sources. The capacitors 100 and 102 bypass the resistors, reducing their effect at RF frequencies. A third capacitor 114 is connected between both capacitors 100 and 102. This capacitor improves the turn-on/turn-off characteristics of the amplifier.

From the discussions given thus far with reference to FIG. 1, it is seen that the power amplifier section includes several power amplifiers $PA_1$ through $PA_n$ which are turned on and off in a digital manner under the control of the digitizer 16 to produce amplitude modulation. The drive for all of the amplifiers $PA_1$ through $PA_n$ is from a common RF driver 23. When the power amplifier, such as amplifier $PA_1$, is turned off, its input impedance is different than what it is when the amplifier is turned on and is active. This variation in input impedance has various reasons. One of these is that the amplifiers' Miller capacitance changes. Thus, when such an amplifier is off, there is no Miller capacitance. Miller capacitance takes place when the amplifier is on and active and is a function of the input-to-output capacitance and gain of the amplifier. When the amplifier is off, there is no gain and, hence, there is no Miller capacitance. In the operation of the circuitry of FIG. 1, various of the amplifiers $PA_1$ through $PA_n$ are selectively turned on or off in dependence upon the magnitude of the input source 12. This variation in the input capacitance will phase modulate all of the amplifiers, because they are driven from a common driver.

For purposes of illustration, the variation in input impedance of each amplifier is presented schematically as including a series circuit including a switch, a capacitor, and a resistor between the input of each amplifier and ground. In FIG. 1, each switch is labelled S, each capacitor is labelled C and each resistor is labelled R. Whenever the associated power amplifier is turned on, the switch S is closed, placing an input capacitance C in series with a resistor R to ground in the input circuit of that amplifier. If the amplifier is not turned on, then the switch S is open. Consequently, during operation of the circuitry in FIG. 1, some of the power amplifiers will be turned on and others turned off causing an unwanted phase modulation of the amplifiers, because they are driven from the common driver 23. This phase distortion modulates the RF carrier and the amplitude modulated signal. This, then, would require a wider frequency bandwidth of operation which would interfere with neighboring stations. If the circuitry is employed for AM stereo broadcast, this phase modulation will degrade the AM stereo information, resulting in distortions.

In accordance with the present invention, this unwanted phase modulation of the power amplifiers $PA_1$ through $PA_n$ is compensated for by circuitry illustrated in FIG. 2. This circuitry, to be described below, places a compensating impedance into the input circuit of each amplifier that is turned off with the compensating impedance corresponding in magnitude with that of the input impedance presented during such periods when an amplifier is turned on. For example, if the input impedance includes a Miller capacitance having a value on the order of 2,000 picofarads, then, the compensating capacitance has a value on the order of 2,000 picofarads. Since the total Miller effect includes both the capacitance and an associated resistance they are represented by capacitor C and resistor R in FIG. 1. Accordingly, the compensating impedance to be inserted into the input circuit of each power amplifier includes a series circuit including a capacitor and a resistor, representing the losses of the capacitor. The compensating impedance for each power amplifier, such as amplifier $PA_1$ appears as illustrated in FIG. 2 to which attention is now directed.

The input circuit to each power amplifier, as shown in FIG. 2, includes the primary windings 82 and 83. In accordance with this aspect of the invention, an input impedance comprised of a series circuit including capacitor 150, resistor 152 and the collector-to-emitter circuit of an NPN transistor 154 is connected across the primary winding 82. A similar impedance circuit is connected across primary winding 83 and it includes a series circuit comprised of capacitor 160, resistor 162, and the collector-to-emitter path of an NPN transistor 164. Diodes 156 and 158 are connected across the collector-to-emitter circuits of transistors 154 and 164, respectively.

As previously discussed, the power amplifier $PA_1$ is turned off in response to a control signal appearing on the digitizer output line $D_1$. When this control signal is at a high logic level, base current is applied to transistor 106, forcing it into saturation. This, as discussed hereinbefore, turns off the power amplifier $PA_1$. In accordance with the present invention, this turn off signal applied to transistor 106 is also applied through a base drive resistor 170 to turn on transistor 154 and is also applied through a base drive resistor 172 to turn on transistor 164. With transistors 154 and 164 being turned on, a compensating input impedance is now connected across the primary windings 82 and 83 so as to compensate for the input impedances presented by the power amplifiers that are turned on. This serves to prevent the unwanted phase modulation discussed hereinbefore.

Although the invention has been described in conjunction with a preferred embodiment, it is to be appreciated that various modifications may be made without departing from the spirit and scope of the invention as defined by the appended claims.

Having described a preferred embodiment of the invention, I claim:

1. A phase modulation compensated RF amplitude modulated amplifier system comprising:

a common RF driver for supplying a common RF driver signal;

a plurality of actuatable RF amplifiers each having an input circuit for receiving said common RF drive signal and each having a fully on condition for amplifying said common drive signal to provide an amplified RF signal and a fully off condition, with each said RF amplifier exhibiting the characteristic that its input circuit has an input impedance which is greater when fully on than that when fully off, thereby tending to provide unwanted phase modulation of said plurality of RF amplifiers;

means for actuating a selected one or more of said RF amplifiers to be fully on in dependence upon the magnitude of an input signal;

means for combining said amplified RF signals provided by the selected actuated ones of said RF amplifiers to thereby provide a combined signal which is amplitude modulated in accordance with the magnitude of said input signals; and, means for selectively adding a compensating impedance to the input circuit of each of said amplifiers that is not actuated to be fully on to thereby compensate for any said unwanted phase modulation of said plurality of RF amplifiers.

2. The system as set forth in claim 1 wherein said means for selectively adding includes an actuatable switching means associated with each said RF amplifier and each said switching means being responsive to said actuating means for connecting a said compensating impedance to the input circuit of its associated RF amplifier when that associated RF amplifier is turned off.

3. A system as set forth in claim 2 wherein each said compensating impedance includes capacitance means.

4. A system as set forth in claim 2 wherein each said compensating impedance includes capacitance means and resistance means.

5. A system as set forth in claim 4 wherein said capacitance means and said resistance means are connected together in series.

6. A system as set forth in claim 2 wherein each said actuatable switching means is connected in series with a said compensating impedance.

7. A system as set forth in claim 6 wherein said compensating impedance includes a resistance means and a capacitance means connected together in series.

8. A system as set forth in claim 6 wherein said compensating impedance has a value corresponding with that of said input impedance when a said RF amplifier is fully on.

* * * * *